US008638084B1

(12) United States Patent
Abugharbieh et al.

(10) Patent No.: US 8,638,084 B1
(45) Date of Patent: Jan. 28, 2014

(54) BANDGAP BIAS CIRCUIT COMPENASTION USING A CURRENT DENSITY RANGE AND RESISTIVE LOADS

(75) Inventors: Khaldoon S. Abugharbieh, San Jose, OR (US); Ying Cao, Pleasanton, CA (US); Geoffrey Richmond, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 433 days.

(21) Appl. No.: 12/910,288

(22) Filed: Oct. 22, 2010

(51) Int. Cl.
*G05F 3/16* (2006.01)
*H01L 21/00* (2006.01)

(52) U.S. Cl.
USPC .............................. 323/313; 438/11

(58) Field of Classification Search
USPC ................. 323/313; 438/11, 14–19
See application file for complete search history.

(56) References Cited

U.S. PATENT DOCUMENTS

| | | | | |
|---|---|---|---|---|
| 5,464,813 A * | 11/1995 | Hascicek et al. | ............... | 505/490 |
| 5,721,548 A * | 2/1998 | Choe et al. | .................... | 341/118 |
| 6,501,256 B1 * | 12/2002 | Jaussi et al. | .................... | 323/315 |
| 6,628,558 B2 | 9/2003 | Fiscus | | |
| 6,901,022 B2 | 5/2005 | Fiscus | | |
| 6,940,318 B1 * | 9/2005 | Wong | .............................. | 327/77 |
| 7,113,025 B2 * | 9/2006 | Washburn | ..................... | 327/539 |
| 7,248,098 B1 * | 7/2007 | Teo | ............................... | 327/539 |
| 7,420,359 B1 * | 9/2008 | Anderson et al. | ............. | 323/316 |
| 7,495,505 B2 * | 2/2009 | Chang et al. | .................... | 327/539 |
| 2006/0043957 A1 * | 3/2006 | Carvalho | ....................... | 323/313 |
| 2008/0091378 A1 * | 4/2008 | Jeong et al. | ..................... | 702/130 |
| 2008/0106326 A1 * | 5/2008 | Gaggl | ............................. | 327/539 |
| 2008/0164937 A1 * | 7/2008 | Kim | ............................... | 327/539 |
| 2009/0196326 A1 * | 8/2009 | Tsukude | ........................ | 374/176 |
| 2009/0216388 A1 * | 8/2009 | Ito | .................................. | 700/299 |
| 2010/0080037 A1 * | 4/2010 | Inoue et al. | .................... | 365/148 |
| 2010/0156386 A1 * | 6/2010 | Imura | ............................ | 323/313 |

OTHER PUBLICATIONS

Banda, H., et al., "A CMOS Bandgap Reference Circuit with Sub-1-V Operation", IEEE J. Solid-State Circuits, vol. 34, No. 5, May 1999, pp. 670-674.
Leung, K.N., et al., "A Sub-1-V 15-ppm/C CMOS Bandgap Voltage Reference Without Requiring Low Threshold Voltage Device", IEEE J. Solid-State Circuits, vol. 37, No. 4, Apr. 2002, pp. 526-530.
Malcovati, P., et al., "Curvature-Compensated BiCMOS Bandgap with 1-V Supply Voltage", IEEE J. Solid-State Circuits, vol. 36, No. 7, Jul. 2001, pp. 1076-1081.
Razavi, B., "Design of Analog CMOS Integrated Circuits", Section 11.3 Temperature-Independent References, Boston, MA: McGraw-Hill, 2001, pp. 381-383.

* cited by examiner

*Primary Examiner* — Adolf Berhane
*Assistant Examiner* — Emily P Pham
(74) *Attorney, Agent, or Firm* — W. Eric Webostad

(57) ABSTRACT

An embodiment of a method for providing a bandgap voltage is described. In such an embodiment, current density of a current in a bandgap circuit is shifted into a current density range having at least a substantially stable scaling factor to enhance temperature stability of the bandgap voltage, and the bandgap voltage output is moved to a target voltage.

20 Claims, 11 Drawing Sheets

| Die ID 621 | Results at Sort Test (at Temperature 1) 622 | Results at Final Test (at Temperature 2) 623 | Coded Action (Bits<3:0>) 624 |
|---|---|---|---|
| Die 601 | 0011 | 0011 | No Change 611 |
| Die 602 | 0001 | 0001 | Increase R4 612 |
| Die 603 | 0111 | 0111 | Decrease R4 613 |
| Die 604 | 0011 | 1111 | Increase R3 and Decrease R4 614 |
| Die 605 | 0111 | 0001 | Decrease R3 and Increase R4 615 |

BANDGAP BIAS CIRCUIT COMPENASTION USING A CURRENT DENSITY RANGE AND RESISTIVE LOADS

FIELD OF THE INVENTION

An embodiment of invention relates to integrated circuit devices ("ICs"). More particularly, the embodiment of the invention relates to bandgap bias circuit compensation for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs among other IC chips conventionally employ stable bias currents. Such stable bias currents may be relatively independent of semiconductor fabrication process, supply voltage, and temperature ("PVT"). A circuit used to provide such stable bias currents is known as a bandgap circuit. Conventionally, a bandgap voltage is generated by a bandgap circuit, and such bandgap voltage is provided to a voltage-to-current converter.

Generally, a temperature independent voltage may be provided by adding two currents, where one current has a negative temperature coefficient and the other current has a positive temperature coefficient. Such two currents may be converted into a voltage using a resistor. A bandgap circuit may be used instead of a resistor ladder to provide more stable bias currents, namely less PVT dependent. It should be understood that a power supply rejection ratio ("PSRR") for a reference voltage is generally better for a bandgap circuit in comparison to a resistor ladder.

Unfortunately, conventional bandgap circuits may not provide sufficient bandgap voltage stability for devices formed using less than 100 nanometer lithographies. Accordingly, it would be desirable and useful to provide a bandgap voltage that was more stable for devices formed using less than 100 nanometer lithographies.

SUMMARY OF THE INVENTION

One or more embodiments generally relate to bandgap bias circuit compensation for an IC.

An embodiment relates generally to a method for providing a bandgap voltage. In such an embodiment, current density of a current in a bandgap circuit is shifted into a current density range having at least a substantially stable scaling factor to enhance temperature stability of the bandgap voltage, and the bandgap voltage output is moved to a target voltage.

Another embodiment relates generally to a method for manufacturing semiconductor dice. In such an embodiment, the dice are wafer-level probed to obtain first digital information associated with bandgap voltages output from bandgap circuits of the dice at a first temperature. The first digital information is stored in association with the dice. After dicing, the dice are tested at a second temperature, different from the first temperature, to obtain second digital information associated with the bandgap voltages output from the bandgap circuit. The first digital information is retrieved from storage. Code settings are obtained responsive to the first digital information and the second digital information for the bandgap circuits of the dice, and at least one of a first resistive load and a second resistive load of a bandgap circuit of the bandgap circuits is adjusted responsive to application of a code setting of the code settings to a die of the dice.

Yet another embodiment is an integrated circuit. In such an embodiment, a bandgap circuit has a first adjustable resistive load and a second adjustable resistive load, where the first adjustable resistive load is for shifting current density of a diode input current in the bandgap circuit into a current density range having at least a substantially stable scaling factor to enhance temperature stability of a bandgap voltage output from the bandgap circuit. The second adjustable resistive load is for moving the bandgap voltage output from the bandgap circuit to a target voltage. A voltage-to-current converter is coupled to receive the bandgap voltage from the bandgap circuit and configured to convert the bandgap voltage into a tracked current.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 6 is a table diagram depicting an exemplary embodiment of a table or data structure that may be used for interpreting code output from the ADC of FIG. 5 for setting resistances of the bandgap reference circuit of FIGS. 2 and 3.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
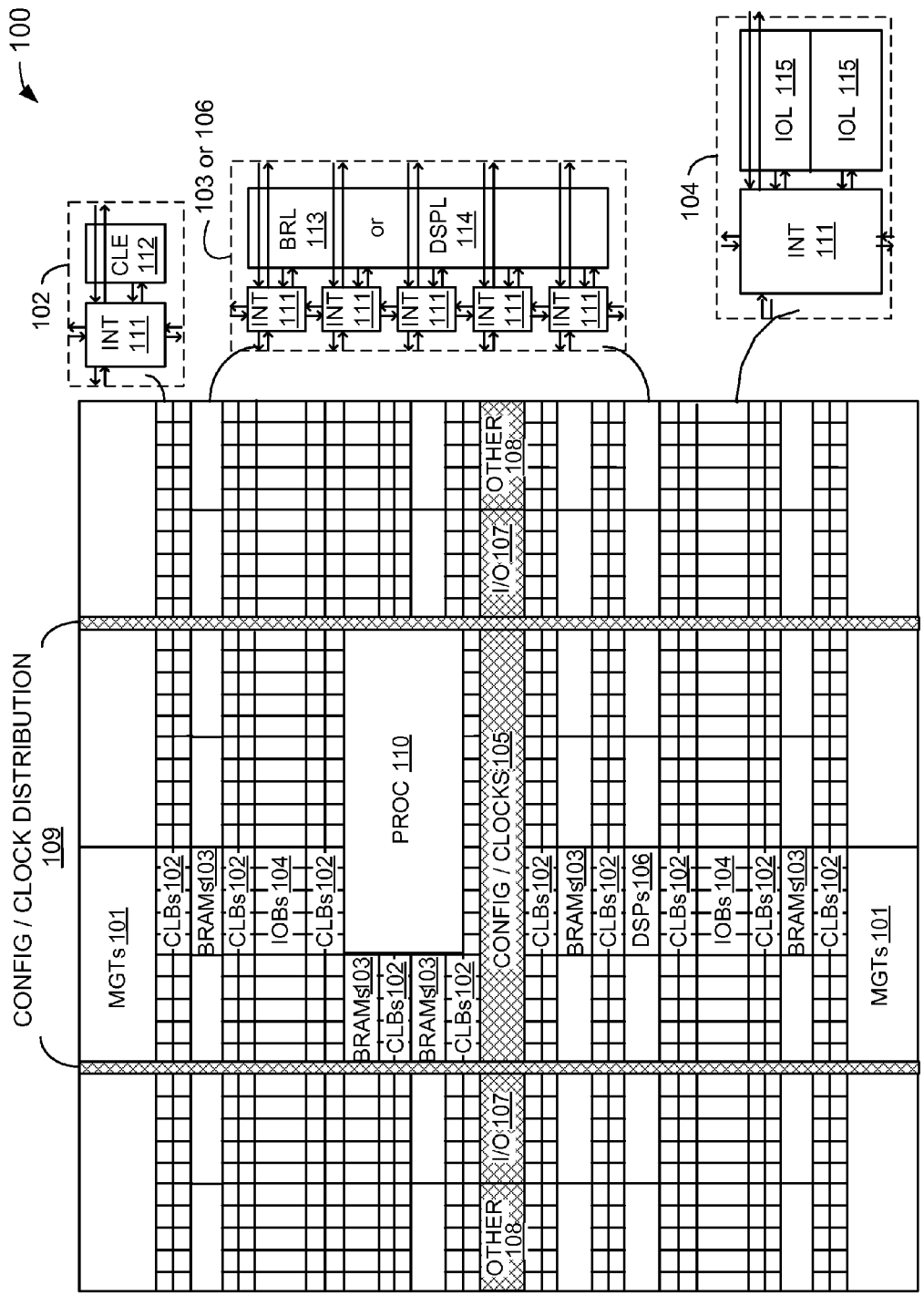
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
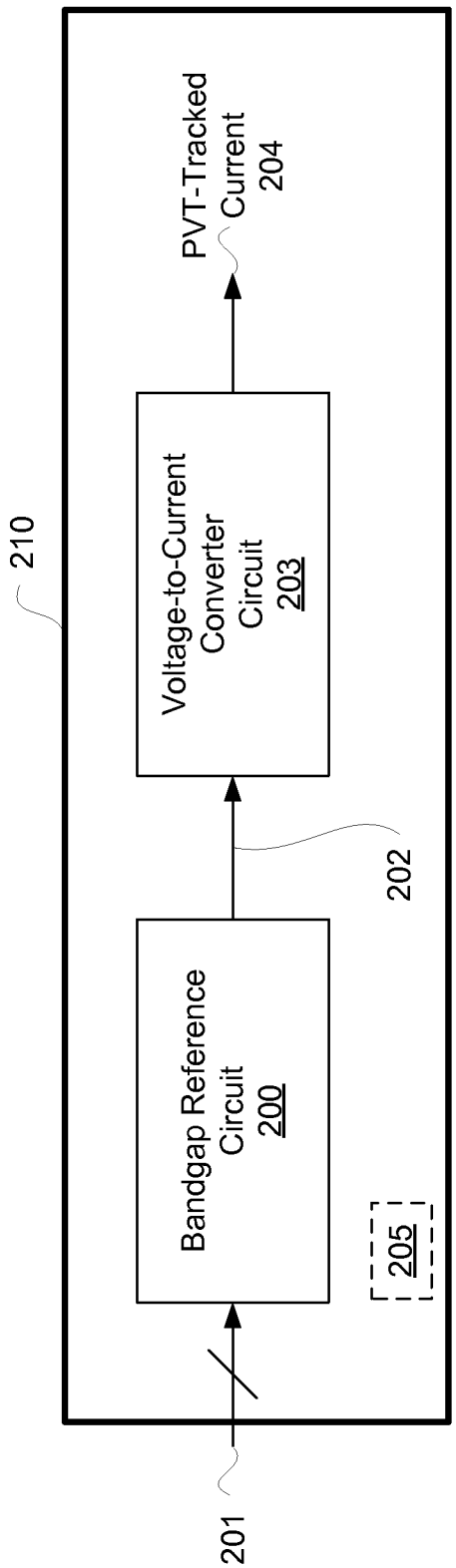
FIG. 2 is a block diagram depicting an exemplary embodiment of an integrated circuit ("IC") in which bandgap circuitry is used, including a bandgap reference circuit.

FIG. 2 is a block diagram depicting an exemplary embodiment of an integrated circuit 210. Integrated circuit 210 may be FPGA 100 of FIG. 1, or any other IC in which bandgap circuitry is used. IC 210 includes bandgap reference circuit 200, and voltage-to-current converter circuit 203. Optionally, IC 210 may include non-volatile memory, namely memory that does not require power to maintain storage of data state, for example such as e-fuses or the like.

Bandgap reference circuit 200 is coupled to receive bit settings 201. Bit settings 201 may be used to set one or more adjustable resistances of bandgap reference circuit 200, as described below in additional detail. Bandgap reference circuit 200 provides bandgap voltage 202 to voltage-to-current converter circuit 203. Voltage-to-current converter circuit 203 may be configured to convert bandgap voltage 202 into a current 204, where current 204 is a PVT-tracked current.

Figure 3:
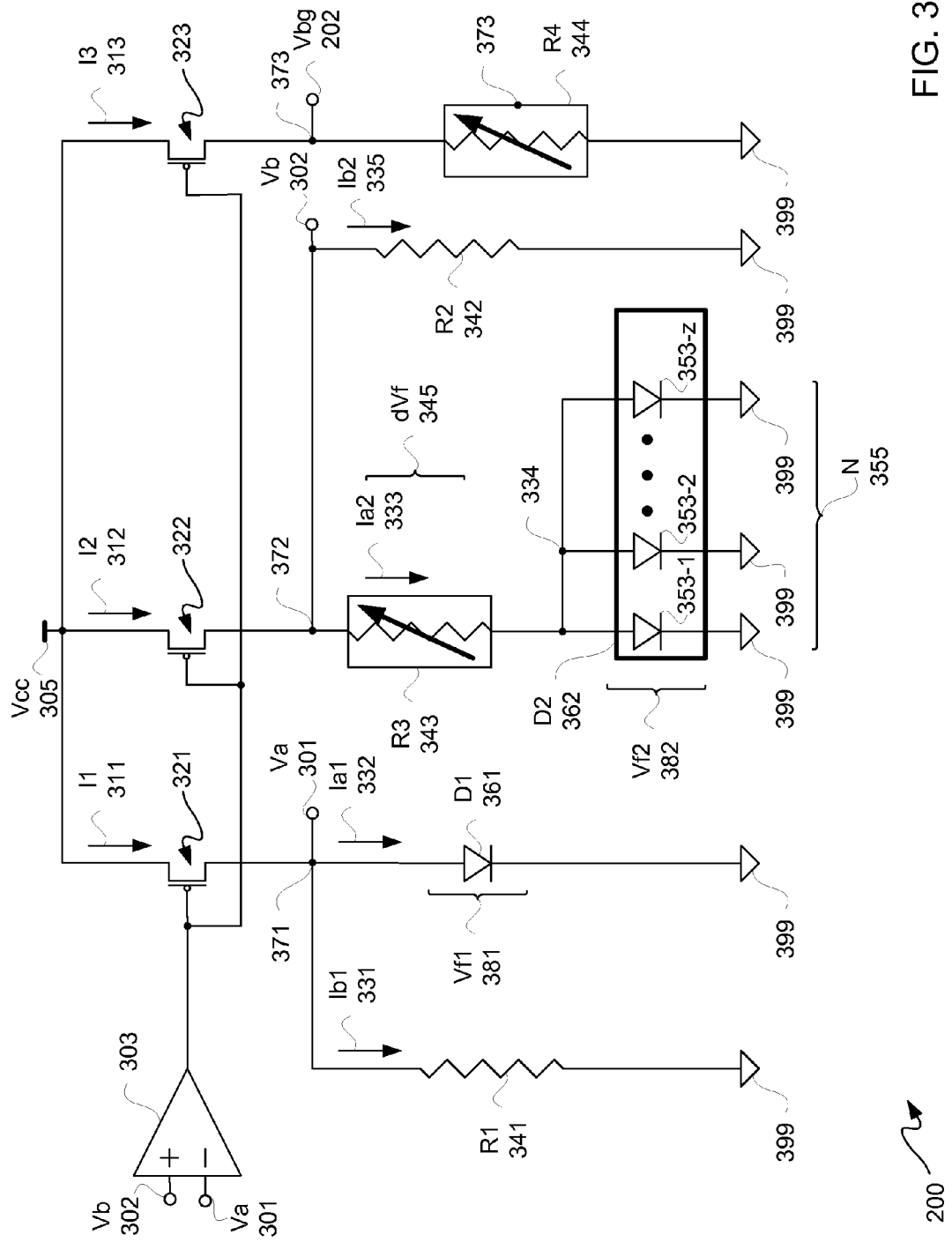
FIG. 3 is a circuit diagram depicting an exemplary embodiment of the bandgap reference circuit of FIG. 2.

FIG. 3 is a circuit diagram depicting an exemplary embodiment of bandgap reference circuit 200 of FIG. 2. In the exemplary embodiment of FIG. 3, bandgap reference circuit 200 is a sub-one voltage bandgap circuit; however, other bandgap circuits may be used in accordance with the scope of the disclosure hereof.

Bandgap reference circuit 200 includes operational amplifier ("op-amp") 303, p-type transistors 321 through 323, fixed resistor 341 and 342, variable resistors 343 and 344, and diodes 361 and 362. Diode 362 in this exemplary embodiment is made up of a plurality of diodes 353-1 through 353-z, for z a positive integer greater than two, coupled in parallel. However, a single diode or multiple diode legs may be used for implementing diode 362.

An adjustable resistive load R3 343 and an adjustable resistive load R4 344 are used to replace fixed resistances of a sub-one volt bandgap reference circuit to provide bandgap reference circuit 200. Using fixed resistances for R3 and R4, a sub-one volt bandgap circuit, is described in: "A CMOS Bandgap Reference Circuit with Sub-1-V Operation" by Hironori Banba, published by IEEE in May 1999. However, the conventional bandgap reference circuit of Banba does not provide sufficient stability over a wide range of temperatures for reasons which are described in additional detail below. Furthermore, the ability to shift output bandgap voltage is not provided by a fixed resistance R4 as in Banba.

Bandgap voltage ("Vbg") 202 is equal to current I3 313 multiplied by resistance R4 344. Thus, for transistor 323 in a substantially conductive state ("ON"), current I3 313 can flow to ground 399 across resistor R4 344 to provide bandgap voltage 202. Consequently, the ability to vary resistance of R4 344 allows bandgap voltage 202 to be adjusted, as described below in additional detail.

Output of op-amp 303 is provided to gates of p-type transistors 321 through 323. Output of op-amp 303 is analog, so states of transistors 321 through 323 may range from OFF to ON, including without limitation anywhere therebetween, to allow for corresponding amounts of currents 311 through 313 to pass, if at all, respectively through such transistors. Even though p-type transistors 321 through 323 are illustratively depicted, it should be understood that n-type transistors or a combination of p- and n-type transistors may alternatively be used. Source nodes of p-type transistors 321 through 323 are coupled to a supply voltage bus 305. In this exemplary embodiment, supply voltage bus 305 is illustratively depicted as being at a VCC voltage level; however, a Vdd or other supply voltage level may be used.

Nodes 371 through 373 are respectively associated with drain nodes of p-type transistors 321 through 323. A drain node of p-type transistor 321 is coupled to a feedback voltage node 371 from which voltage Va 301 is sourced for feedback input to op-amp 303. A drain node of p-type transistor 322 is coupled to a feedback voltage node 372 from which a voltage Vb 302 is sourced for feedback input to op-amp 303. Lastly, a drain node of p-type transistor 323 is coupled to an output node 373 from which bandgap voltage 202 is sourced. In an embodiment, node 373 may alternatively be thought of as being located within the box denoting variable resistor R4 344, as generally illustrated in FIG. 3, as described below in additional detail with reference to FIG. 11. Voltage Va 301 and voltage Vb 302 are provided as respective feedback voltages for input to op-amp 303. In this exemplary embodiment, voltage Va 301 is provided to a minus port of op-amp 303, and voltage Vb 302 is provided to a plus port of op-amp 303.

One end of resistor R1 341 is coupled to a drain node of p-type transistor 321, and another end of resistor R1 341 is coupled to ground 399. An input of diode D1 361 is coupled to a drain node of p-type transistor 321, and an output of diode D1 361 is coupled to ground 399. Diode D1 361 is coupled in a forward bias direction from a drain node of p-type transistor 321 to ground 399.

From feedback voltage node 371, voltage Va 301 is coupled to an end of resistor R1 341 and an input of diode D1 361, where currents Ib1 331 and Ia1 332 respectively flow through resistor R1 341 and diode D1 361 to ground 399. A voltage Vf1 381 across diode D1 361 is equal to voltage Va 301, which is equal to voltage Vb 302, responsive to op-amp 303 feedback.

An end of variable resistor R3 343 is coupled to a drain node of p-type transistor 322, and another end of variable resistor R3 343 is coupled to node 334. Between node 334 and ground 399 are diodes 353-1 through 353-z coupled in parallel forming diode D2 362. Across each of such diodes 353-1 through 353-z is a voltage Vf2 382. A current Ia2 333 flows across resistor R3 343.

An adjustable differential feedback voltage dVf 345 is across resistor R3 343. Voltage dVf 345 is equal to voltage Vf1 381 minus voltage Vf2 372. This differential voltage dVf 345 may be mathematically expressed as follows:

$$dVf = (KT/q)*(lnN), \quad (1)$$

where T is temperature in degrees Kelvin, K is the Boltzmann constant, and N is a ratio of size between diode D2 362 and diode D1 361. From Equation (1) it should be understood that this differential feedback voltage dVf 345 has a positive temperature coefficient. In other words, as temperature increases, so does voltage.

Resistor R2 342 is coupled to a drain node of p-type transistor 322 and ground 399, and thus is in parallel with the series formed by variable resistor R3 343 and diode D2 362. Variable resistor R4 344 is coupled to a drain node of p-type transistor 323 and ground 399.

For transistors 321 through 323 in an ON state, current I1 311, I2 312, and I3 313 are provided from VCC supply bus 305 to source terminals of p-type transistors 321 through 323, respectively, for providing to nodes 371 through 373, respectively. Currents I1 311, I2 312, and I3 313 generally equal one another. Current Ib2 335 flows across resistor R2 342 from node 372 to ground 399.

The sum of currents Ia2 333 and Ib2 335 is generally equal to current I2 312. Current Ib2 335 is equal to voltage Vf1 381 divided by resistance of resistor R2 342. Voltage Vf1 381 has a negative temperature coefficient. By negative temperature coefficient it is generally meant that voltage decreases with increasing temperature. Current Ia2 333 may be mathematically expressed as follows:

$$Ia2 = ((KT/q)*(lnN))/R3. \quad (2)$$

It should be understood that q in each of Equations (1) and (2) is the amount of charge. Accordingly, bandgap voltage which is equal to R4 multiplied by I3 may be alternatively mathematically expressed as follows:

$$Vbg = R4*((Vf1/R2) + ((KT/q)*(lnN)/R3)) \quad (3)$$

In other words, I3 is equal to I2, and I2 is equal to Ia2+Ib2. Furthermore, Ia2 is equal to dVf/R3, and Ib2 is equal to Vf1/R2. Furthermore, bandgap voltage Vbg is equal to R4((Vf1/R2)+(dVf/R3)).

It should be understood that topology of bandgap reference circuit 200 may have a non-ideal behavior of N factor 355, such as in Equation (3). This N factor 355 is substantially dependent on current density of diodes, such as PNP diodes and/or NPN diodes. More particularly, for purposes of clarity by way of example and not limitation, it shall be assumed that diodes 353-1 through 353-z and diode 361 are all PNP diodes. Thus, more particularly, it should be understood that N factor 355 is dependent on current density of current passing through diodes D2 362, which in this exemplary embodiment is formed of PNP diodes 353-1 through 353-z coupled in parallel as legs of diode D2 362.

Figure 4:
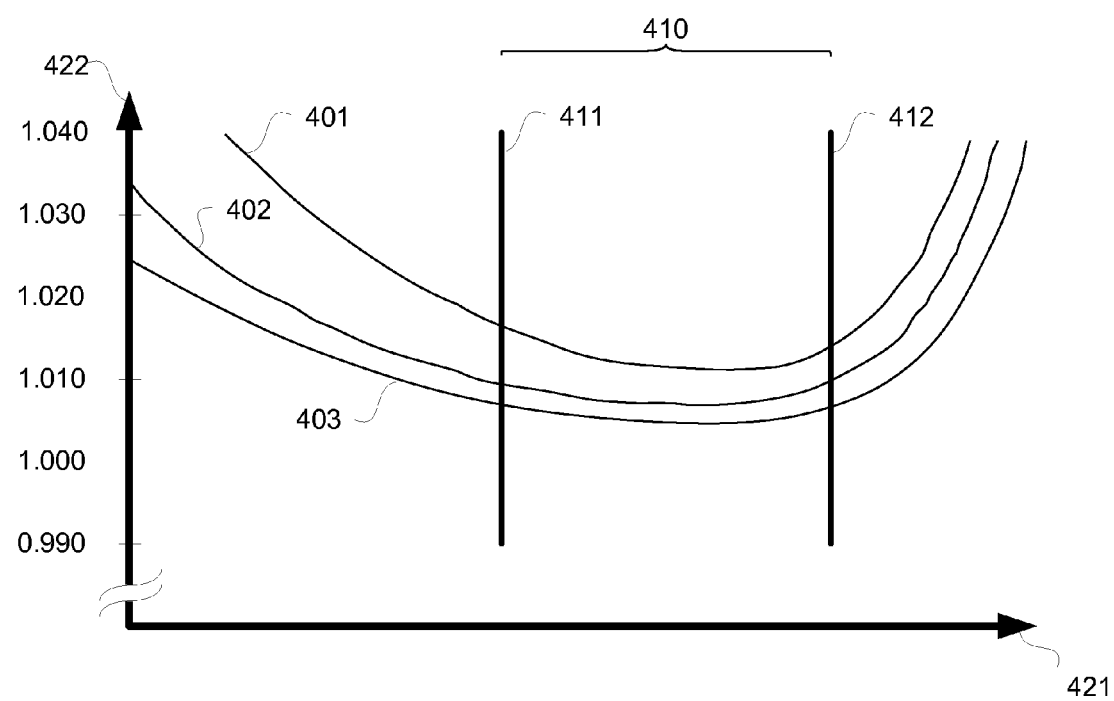
FIG. 4 is a graph depicting an exemplary embodiment of current density versus scalability factor for PNP diodes.

FIG. 4 is a graph depicting an exemplary embodiment of current density 421 versus scalability factor n 422 for PNP diodes. Curves 401 through 403 may be for current density versus scalability factor n at different temperatures T. In other words, x-axis or current density axis 421, which may be in amps per micrometer squared ($A/\mu m^2$) is current density of a size of a PNP diode. Of course, different sizes of PNP diodes, or NPN diodes, may be used; however, from a single diode size, other sizes of diode may be understood. Y-axis or scalability factor axis 422 ideally would be flat. In other words, for an n scalability factor of approximately a constant value, the natural log term, In N, would be approximately constant in Equation (3). However, as may be seen from curves 401, 402, and 403, such scalability factor n not constant over the range of possible current densities at different temperatures.

Accordingly, a range 410 of current densities, as generally indicated by lines 411 and 412, may be selected to define a usage range for voltage of PNP diodes. In other words, within a selected current density usage range 410, scalability factor is closer to being a constant value throughout the range, namely more stable, than outside of current density usage range 410. A more stable term for the natural log term in Equation (3) means a more stable bandgap voltage for different temperatures.

Heretofore, it may have generally been assumed that the natural log term in Equation (3) was a constant; however, as indicated by the graphical diagram of FIG. 4, such natural log term is not a constant. It should further be understood that current density for a bandgap reference circuit 200 may not in some instances fall within current density usage range 410 without adjustment. Accordingly, a variable resistor R3 343 may be used, or more particularly, may be set, to move current density of current Ia2 333 provided to node 334 for a current density within current density usage range 410. For an n scalability factor of a PNP diode being not equal to 1, such as in the example of FIG. 4, Equation (1), $dVf=(KT/q)*(\ln N)$, will no longer be accurate. If I1a and I2a are equal, then dVf is proportional to $(KT/q)(n1*\ln(1/\text{Area of D1})-n2*\ln(1/\text{Area of D2}))$. If n2 and n1 are not equal, the positive temperature coefficient of the bandgap voltage may be less controlled and less matched with the negative temperature coefficient. This is likely to cause bandgap voltage to change with temperature. Thus, by adjusting current density of current Ia2 333 to be within a relatively flat range, bandgap voltage may be more stable with changes in temperature. Moreover, variability of curves 401 through 403 may be more pronounced for devices having been formed with a minimum dimension of less than 100 nanometers. Furthermore, even though curves 401 through 403 all have a scalability factor n greater than 1, it should be understood that in other embodiments one or more of curves 401 through 403 may have a scalability factor that is less than or equal to one for some current densities.

To recapitulate, it should be understood that an n scalability factor is not necessarily flat with respect to a range of current densities for various temperatures, and accordingly, a temperature coefficient term may not be accurately predicted by equations derivable from FIG. 3. However, by selecting a range of current density having a relatively flat scalability factor by adjusting resistance of R3, a positive or negative temperature coefficient may be compensated.

Another adjustment to bandgap voltage may be for its magnitude, which may be performed with or independently of enhancing temperature stability of such bandgap voltage. By adjusting resistance of variable resistor R4 344, bandgap voltage Vbg 202 may be centered or re-centered to a target voltage range. Of course, it is possible that such bandgap voltage is centered on a part, namely on a die, but it may not be centered on all dice of a wafer. Furthermore, it should be understood that changing the resistance value of resistor R4 344 while allowing centering or adjusting of bandgap voltage to a target value does not mitigate against a non-ideal scaling factor n, where such scaling factor is not flat. Thus, by adjusting resistance of resistor R3 343, compensation of temperature coefficients may be obtained in order to provide a bandgap voltage that is sufficiently stable with temperature.

As described below in additional detail, nonvolatile memory or combinatorial logic may be used to provide signals for setting resistances of resistors R3 343 and R4 344. The value of R3 may be set generally to an optimal current density for diodes 353-1 through 353-z. Furthermore, the value of R3 343 may be set such that the scalability factor is equal to or at least approximately equal to a constant value, for example a value of 1, for temperature compensation over a range of temperatures. In FIG. 4, the range of temperatures extends from negative 40° C. to 125° C.; however, this is merely an example range and other temperature ranges may be used. Furthermore, by setting the resistance of R4 344, bandgap voltage may be centered or re-centered, as previously described.

Figure 5:
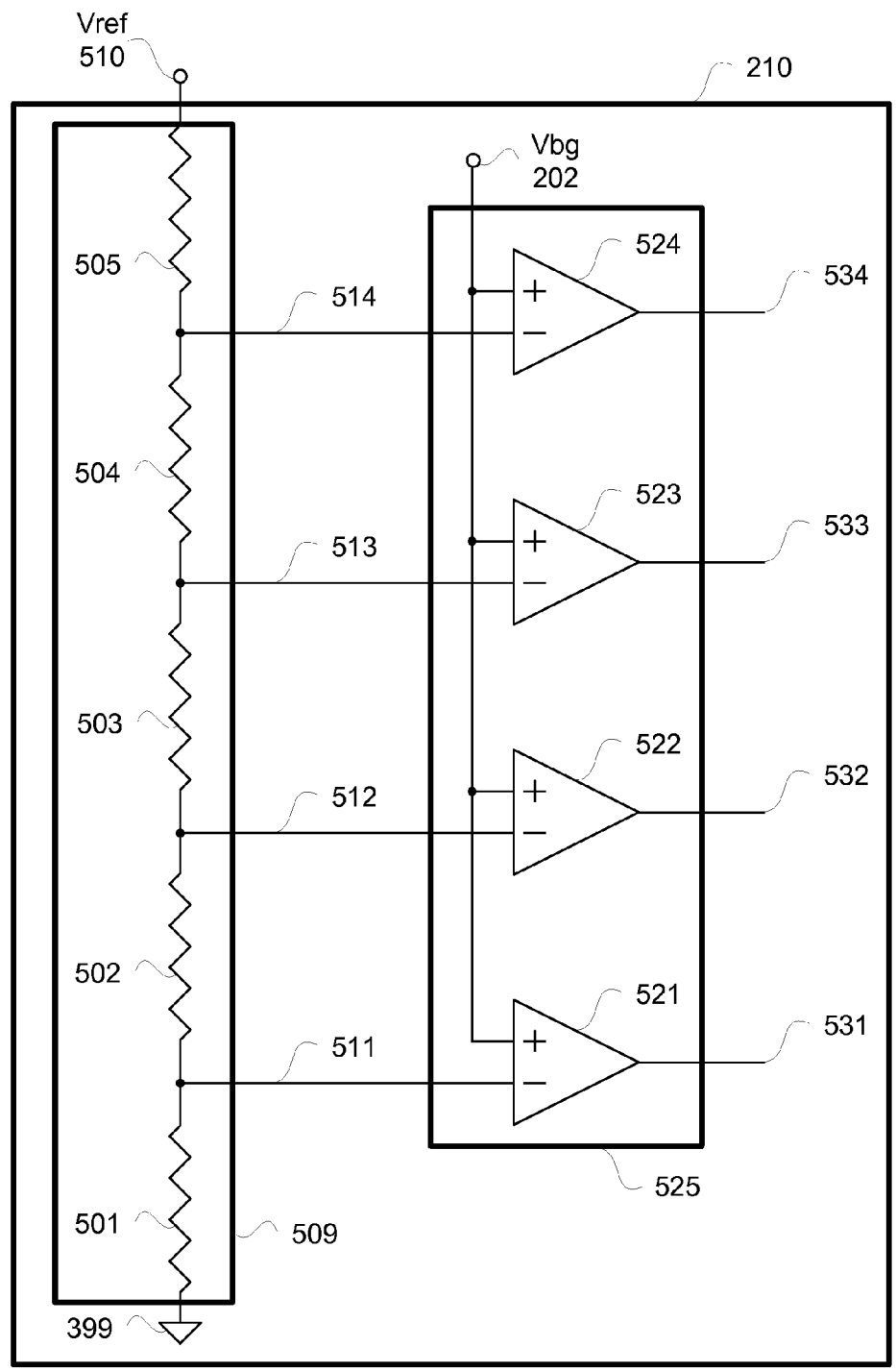
FIG. 5 is a block/circuit diagram depicting an exemplary embodiment of a resistor ladder coupled to an analog-to-digital converter ("ADC") of the integrated circuit of FIG. 2.

As described below in additional detail, bandgap voltages may be compared with various voltages generated from a resistor ladder. FIG. 5 is a block/circuit diagram depicting an exemplary embodiment of a resistor ladder 509 coupled to an analog-to-digital converter ("ADC") 525 of integrated circuit 210. It should be understood that even though an external resistor ladder 509 and/or an external ADC 525 may be used, it is assumed for purposes of clarity by way of example and not limitation, that an internal resistor ladder 509 and an internal ADC 525 is used. However, a reference voltage ("Vref") 510 may be an externally supplied reference voltage. Reference voltage 510 may be supplied by a prober during a wafer sort and may subsequently be supplied by a tester during a final test, as described below in additional detail.

It should be understood that resistor ladder 509 generally does not have a good PSRR as compared with bandgap reference circuit 200. It should further be understood that voltages 511 through 514 obtained from corresponding taps of resistor ladder 509 may tend to change with changes in reference voltage ("Vref") 510; however, such voltages 511 through 514 may not change with respect to temperature, provided resistors 501 through 505 are properly matched.

ADC 525 includes comparators 521 through 524. Even though a plurality of comparators is illustratively depicted as an ADC, it should be understood that an ADC need not be used, but rather separate comparators 521 through 524 may be used.

Resistor ladder 509 includes resistors 501 through 505 coupled in series between ground 399 and reference voltage 510. A tap between resistors 504 and 505 is where a voltage V4 is sourced as voltage 514. Voltage 514 is provided to a minus port of a comparator 524 of ADC 525. A voltage 513 is sourced from a tap between resistors 503 and 504. Voltage 513 is less than voltage 514. Voltage 513 is provided to a minus port of comparator 523. A voltage 512 is sourced from tap between resistors 502 and 503, and voltage 512 is less than voltage 513. Voltage 512 is provided to a minus port of comparator 522. A voltage 511 is sourced from a tap between resistors 501 and 502, and voltage 511 is less than voltage 512. Voltage 511 is provided to a minus port of comparator 521. Plus ports of comparators 521 through 524 are all coupled to receive bandgap voltage ("Vbg") 202 from bandgap reference circuit 200 of FIGS. 2 and 3.

Outputs 531 through 534, respectively from comparators 521 through 524, are digital outputs. It should be understood that even though four comparators are illustratively depicted, it should be understood that fewer or more comparators may be used. It should further be understood that the number of comparators may be increased as a function of comparison resolution. It should further be understood that in many implementations, significantly more than four comparators may be implemented to enhance accuracy of a bandgap voltage produced.

It should be understood that a reference voltage 510, which is a temperature independent reference voltage, is used to provide other temperature independent voltages, namely voltages 511 through 514, for comparison with bandgap voltage 202. It should further be understood that if a voltage on a minus port of a comparator is less than voltage on a plus port of such a comparator, then output of such comparison is a logic 1. It should further be understood that if voltage on a minus port of a comparator is larger than on a plus port of such a comparator, then output of such comparator is logic 0. Lastly, it should be understood that reference voltage 510 may, but need not, be a supply level voltage, as reference voltage 510 generally may be any nominal voltage for purposes of testing as described herein.

For a test of a bandgap voltage, reference voltage 510 may be set to supply a nominal voltage, and bandgap voltage 202 may be provided at two different temperatures. As described below in additional detail, a first temperature ("Temperature 1") is used during what is generally understood as a wafer sort test, and a second temperature ("Temperature 2") is used during what is generally understood as a "final" test of individual dice. At each temperature, outputs from ADC 525 may be obtained. These outputs may be used to represent a value that is coded. If bandgap voltage of a die is sufficiently centered and is independent of temperature, code output from ADC 525 would be 0 0 1 1, going from output 534 to output 531, and such code would not change relative to the range of temperature, such as from negative 40° C. to 120° C. for example.

FIG. 6 is a table diagram depicting an exemplary embodiment of a table or data structure 600. Data structure 600 may be used for interpreting code output from ADC 525 of FIG. 5 for setting resistances of R3 and R4 of bandgap reference circuit 200 of FIGS. 2 and 3.

Column 621 is for respective die identifiers ("IDs"). Column 622 is for results output from ADC 525 at a sort test at a Temperature 1. Column 623 is for results output from ADC 525 at a final test at Temperature 2. It should be understood that Temperature 1 and Temperature 2 are different temperatures in order to determine whether a positive sloping temperature coefficient or a negative sloping temperature coefficient is present. In other words, generally two points via different temperatures are used in order to have two points in which to determine whether a temperature coefficient portion is increasing or decreasing, namely the slope of the curve or line. For purposes of clarity by way of example and not limitation, it shall be assumed that Temperature 1 is less than Temperature 2. Lastly, column 624 is a coded action, namely bits output from ADC 525 are interpreted from column 622 and 623 to determine what action to take for setting values, if at all, for setting one or more of variable resistances R3 or R4.

For the example of die 601 in column 621, output from ADC 525 at Temperature 1 is 0 0 1 1 and output of ADC 525 at Temperature 2 is 0 0 1 1. Accordingly, the coded action in column 624 is no change 611. For die 602 of column 621, results at Temperatures 1 and 2 respectively are 0 0 0 1 and 0 0 0 1. Accordingly, this indicates that bandgap voltage 202 is not properly centered. Thus, coded action of column 624 for die 602 in response to such results is to increase resistance of resistor R4, namely increase R4 612. Die 603 has results at Temperatures 1 and 2, respectively, of 0 1 1 1 and 0 1 1 1. This indicates that bandgap voltage 202 is not properly centered, but in contrast to the example of die 602, bandgap voltage 202 is too great for die 603, whereas for die 602 bandgap voltage was too small. Accordingly, the coded action in column 624 for die 603 is to decrease resistance of resistor R4, namely decrease R4 613.

Continuing the examples in data structure 600, die 604 of column 621 has results at Temperatures 1 and 2 of 0 0 1 1 and 1 1 1 1, respectively. This indicates that such die 604 while still attached to a wafer was properly centered and had the correct current density at Temperature 1, but bandgap voltage 202 significantly increased at Temperature 2 when die 604 was an individual die. As previously described, bandgap voltage is to be decreased by decreasing resistance of resistor R4. However, additionally, to have bandgap voltage 202 be held relatively stable at least as between Temperatures 1 and 2, current density is to be decreased. In other words, an n stability factor is significantly larger than one of an unadjusted current density, because bandgap voltage is too large in this example. To reduce such stability factor n, namely to make it equal to or closer to a constant such as 1 for example, resistance of resistor R3 of bandgap reference circuit 200 is increased. This increase in resistance effectively reduces current density of current passing through diode D2, which may be implemented as multiple diodes coupled in parallel. Thus, the coded action in column 624 for die 604 is to increase R3 and decrease R4 614.

In the example of die 604, bandgap voltage increased as between Temperatures 1 and 2. This indicates that such bandgap voltage has a positive temperature coefficient. It should be understood that when R3 is increased, such positive temperature coefficient portion of current is reduced in accordance with Equation (3).

For die 605 of column 621, results at Temperatures 1 and 2, respectively, are 0 1 1 1 and 0 0 0 1. In contrast to dice 601, 602, and 603, bandgap voltage for die 605 is varying at least as between Temperatures 1 and 2. In the examples of dice 601 through 603, bandgap voltage was constant as indicated by having the same results at Temperatures 1 and 2, namely bandgap voltage was constant at least as between Temperatures 1 and 2. However, in the example of die 604, bandgap voltage changed as between Temperatures 1 and 2.

For the example of die 605, bandgap voltage as between Temperatures 1 and 2 decreased. Thus, resistance R3 is to be decreased in order to increase current density of current passing through diode D2, namely to move a stability factor n closer to equal to a constant value such as 1 for example. Additionally, bandgap voltage is too low at Temperature 2 during final test, and accordingly such bandgap voltage may be increased by increasing resistance of resistor R4. Accordingly, the coded action for die 605 in column 624 is to decrease R3 and increase R4 615.

It should be understood that when resistance of resistor R3 is decreased, a positive temperature coefficient of current is increased in accordance with Equation 3. It should further be understood that coded action column 624 lists in textual form, the acts to be performed as opposed to the actual codes, namely strings of bits, which may vary from application to application. However, it should be understood that coded action may be a string of bits, namely bits <3:0> for providing to combinatorial logic or nonvolatile memory or a combination thereof for setting resistances of R3 and R4 accordingly.

Figure 7:
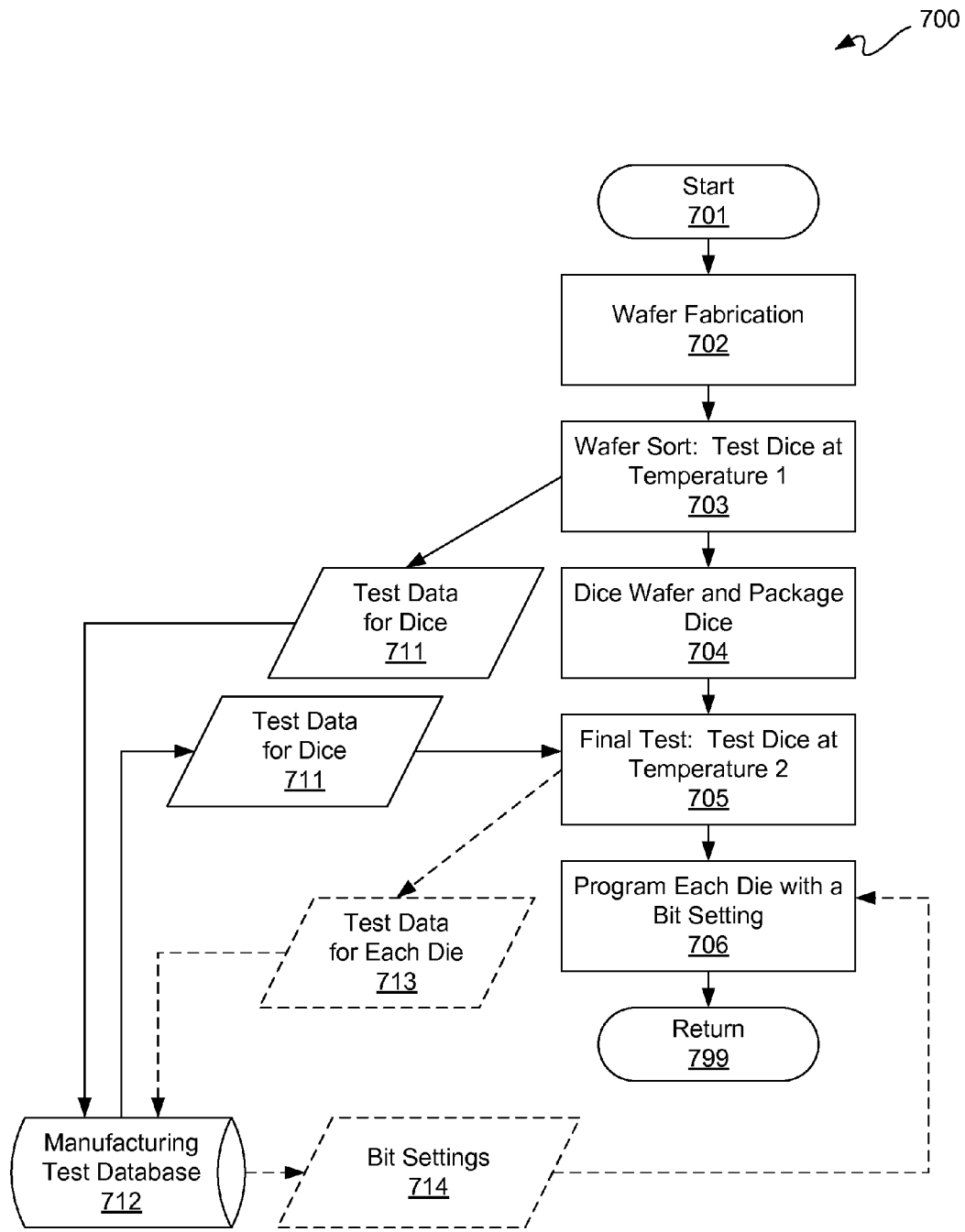
FIG. 7 is a flow diagram depicting an exemplary embodiment of a manufacturing flow.

FIG. 7 is a flow diagram depicting an exemplary embodiment of a manufacturing flow 700. Manufacturing flow 700 is started at 701. At 702 a wafer is fabricated with multiple dice. At 703, such dice of such wafer are tested at a Temperature 1. This test is often referred to as a "wafer sort". Obtaining output from ADC 525 at 703 was previously described, and such description is not repeated here for purposes of clarity. From wafer sort 703, test data for dice 711 may be obtained and provided to a manufacturing test database 712. It should be understood that manufacturing test database 712 may be offsite from where wafer sort is, may be onsite where wafer sort is, may be a portable storage device that travels with dice, may be non-volatile memory on the dice, or any combination thereof.

At 704, the wafer tested at 703 is diced and the dice therefrom are packaged. At 705, the dice packaged at 704 are tested at Temperature 2. This testing may be referred to as a "final test". For final test at 705, test data for dice 711 may be obtained from manufacturing test database 712. Again, such test data may be used in accordance with a data structure, such as data structure 600 of FIG. 6, for determining what coded action is to be used for each die, namely for determining how to adjust resistances of one or more of R3 and R4, if at all, for each bandgap reference circuit 200 of each die 210.

Optionally, final test 705 may be used to generate test data for each die 713 as above, and then such test data may be provided to manufacturing test database 712. Accordingly, it should be understood that test data for dice 711 and test data for each die 713 may correspond to columns 622 and 623, respectively, for dice 601 through 605. Manufacturing test database 712 may be configured, such as by a look-up table for example, to provide bit settings 714 for each of such dice. Such bit settings 714 may be provided back to a tester for programming each die with a bit setting at 706.

At 706, each die may be programmed with a bit setting determined at 705, or optionally with a bit setting of bit settings 714 provided by database 712. At 799, manufacturing flow 700 may return for other testing of dice.

Figure 8:
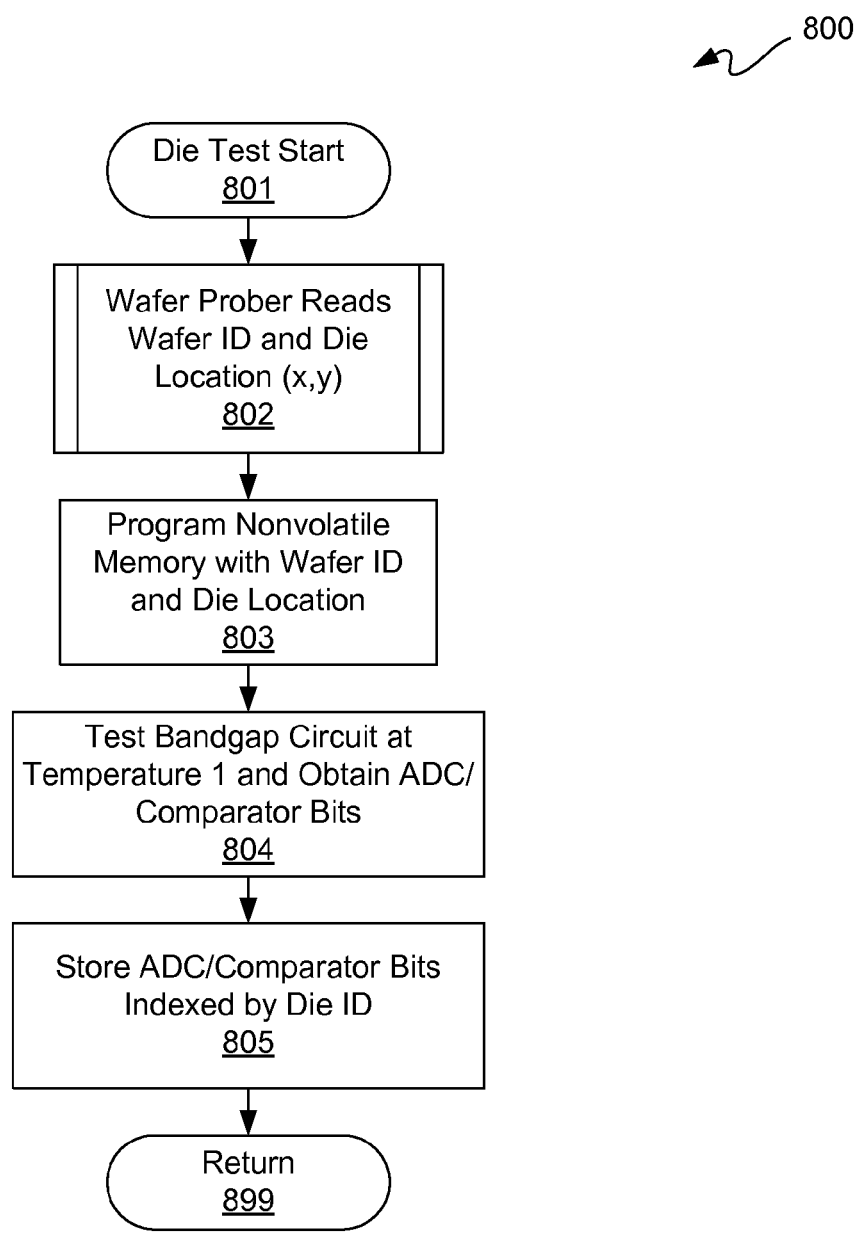
FIG. 8 is a flow diagram depicting an exemplary embodiment of a wafer sort test flow.

FIG. 8 is a flow diagram depicting an exemplary embodiment of a wafer sort test 800. Wafer sort test 800 may be wafer sort 703 of FIG. 7. Wafer sort test 800 starts a die test at 801. At 802, wafer-level probing is initiated, including having a prober read wafer IDs and optionally die locations. Die x and y coordinates on a wafer, as well as a wafer ID, may be recorded on each die in a known manner. Furthermore, it should be understood that such wafer ID may be a unique identifier so as not to confuse dice. For purposes of clarity by way of example and not limitation, it shall be assumed that nonvolatile memory used to record wafer ID and die location are e-fuses. However, it should be understood that other known nonvolatile circuits may be used for recording wafer ID and die location. For example, nonvolatile memory may be flash memory or EEPROM. Thus in contrast to e-fuse programming, such nonvolatile memory need not be one-time programmable memory.

At 803, the wafer ID and die location read at 802 are recorded, such as programmed into nonvolatile memory. It should be understood that recording die location may be used to correlate how neighboring dice are programmed for resistances R3 and R4 for purposes of process control.

At 804, a bandgap circuit, such as bandgap reference circuit 200, for each die is tested, such as by using a prober as part of wafer-level probing, at a Temperature 1. A reference voltage 510 is applied to the dice, and ADC or comparator bits for such testing are obtained as previously described with reference to FIG. 5. Such ADC or comparator bits obtained at 804 may be stored at 805 as an index for example by die ID, such as indicated with data structure 600 of FIG. 6. Operations at 805 may correspond to generating test data for dice 711 which is stored in manufacturing database 712 of FIG. 7. Optionally or alternatively, at 805, such ADC or comparator bits obtained at 804 may be stored in non-volatile memory 205 of FIG. 2 of associated die. Thus, assuming dice of a wafer have usable non-volatile memory, namely memory that does not require power to maintain storage of data states, then such bits obtained at 804 may be locally stored on each such die associated therewith. At 899, such die test may return.

Figure 9:
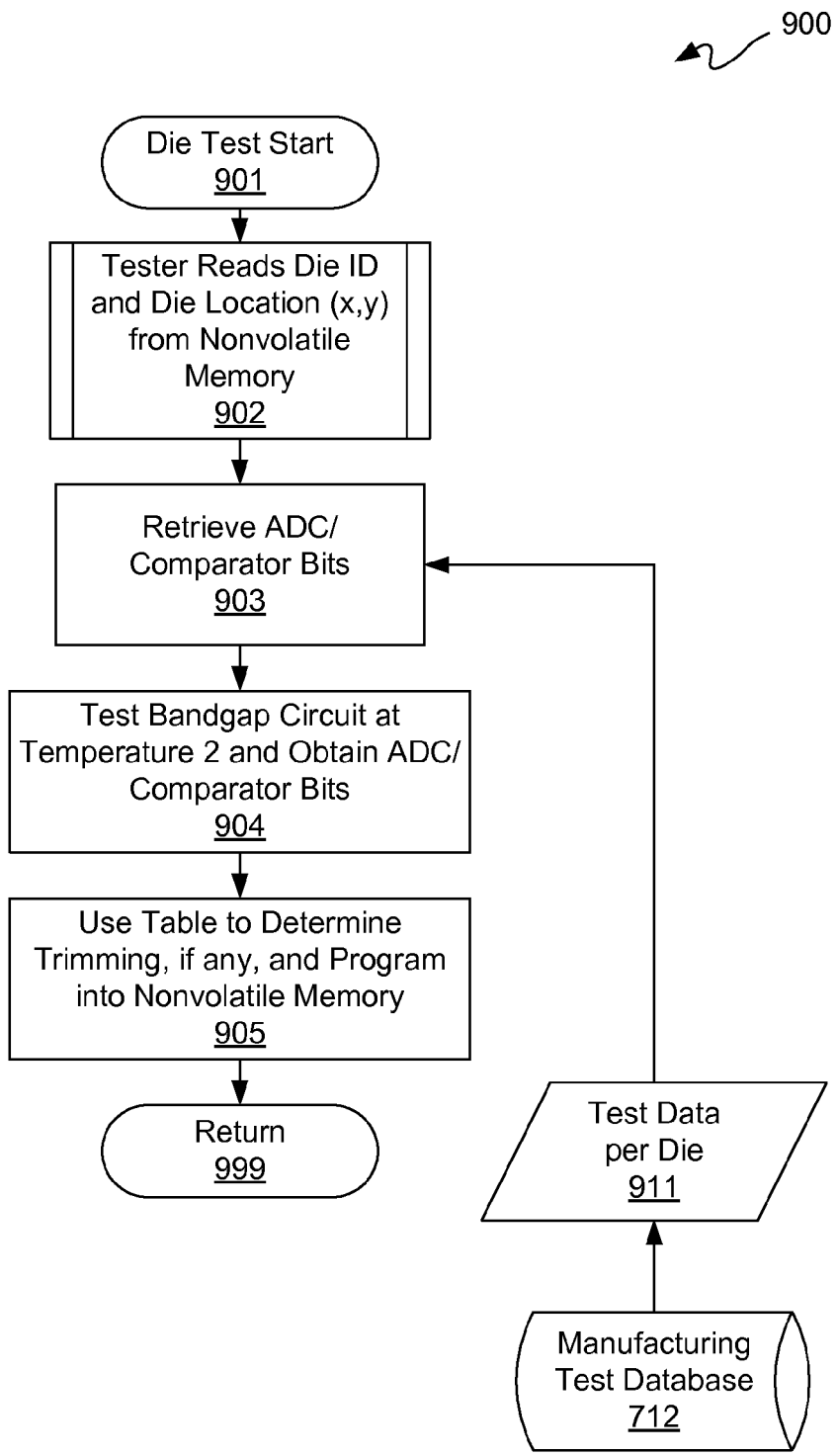
FIG. 9 is a flow diagram depicting an exemplary embodiment of a "final test" or "packaged die" test flow.

FIG. 9 is a flow diagram depicting an exemplary embodiment of a die test flow 900. Die test flow 900 is for an individual die, and may be used at final test 705 and programming 706 of FIG. 7.

Die test 900 starts at 901. At 902, a tester reads a die ID and die location from nonvolatile memory of such die. Again, for purposes of clarity by way of example and not limitation, it shall be assumed that such nonvolatile memory may be e-fuses or other nonvolatile memory.

At 903, ADC or comparator bits for the die identified at 902 may be obtained as test data per die 911 from manufacturing test database 712. Optionally or alternatively, at 903, ADC or comparator bits for the die identified at 902 may be obtained as test data per die 911 from non-volatile memory 205 of FIG. 2 of each such die. It should be understood that die test flow 900 is for an individual die and there may be multiple individual dice to be tested. Die test data need not be obtained for each die at a time. For example, a batch of die test data may be obtained for a batch of dice to be tested.

At 904, a bandgap circuit, such as a bandgap reference circuit 200, is tested at Temperature 2, and ADC or comparator bits are obtained from such testing, as previously described. At 905, a table or other data structure may be used to determine resistance settings for resistors R3 and R4 for the bandgap circuit, such as bandgap reference circuit 200. In other words, a data structure may be used to determine if any resistance trimming is to be employed, and if any resistance trimming is to be used, the settings for such resistance trimming may be obtained. Furthermore, any such resistance trimming, or the absence thereof, may be programmed into nonvolatile memory at 905. At 999, die test flow 900 returns for other testing.

Figure 10:
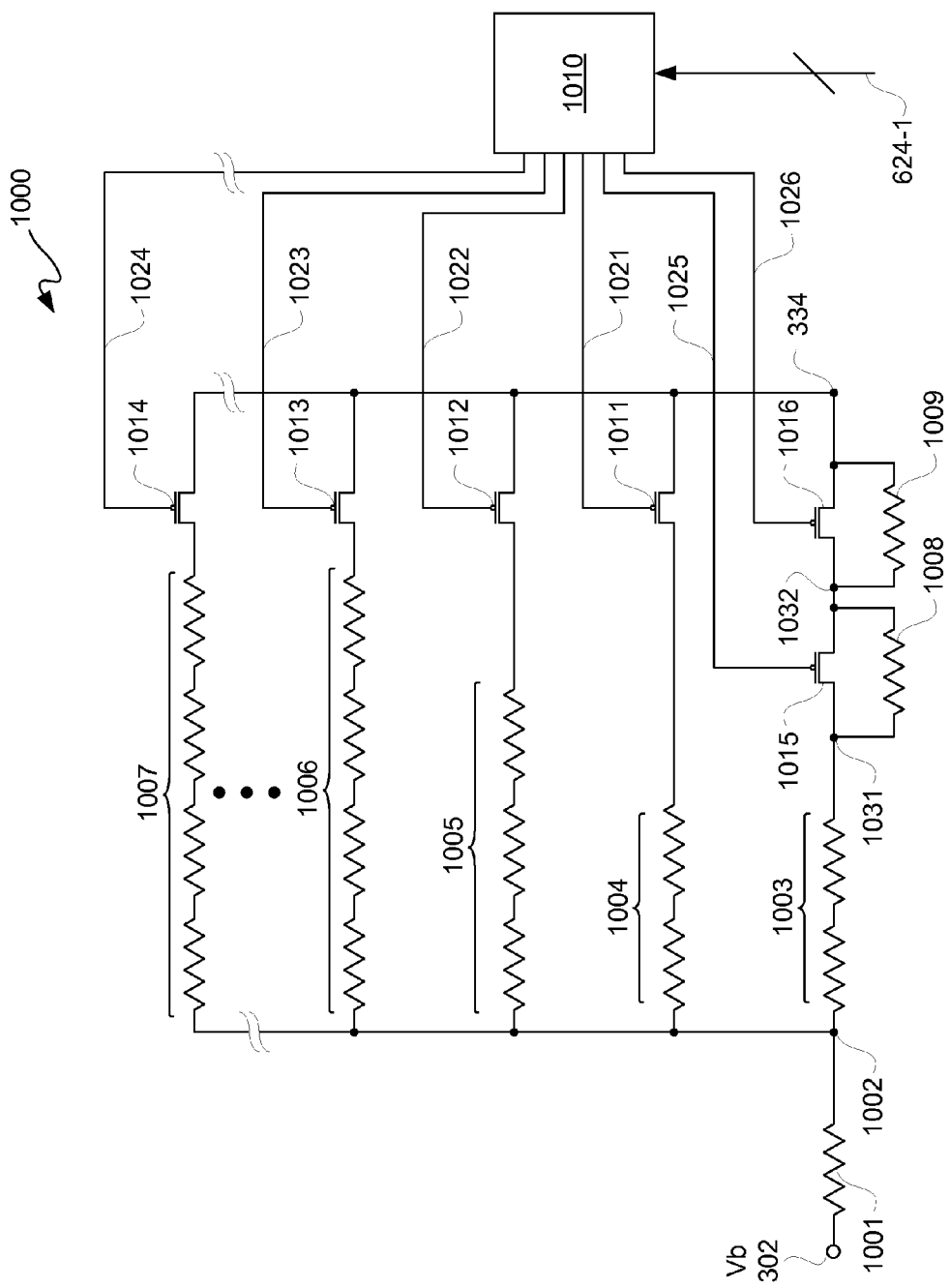
FIG. 10 is a block diagram depicting an exemplary embodiment of a variable resistor that may be used as a variable resistor of the bandgap reference circuit of FIGS. 2 and 3.

FIG. 10 is a block diagram depicting an exemplary embodiment of a variable resistor 1000. Variable resistor 1000 may be used as variable resistor R3 of bandgap reference circuit 200 of FIG. 3.

Voltage Vb 302 is coupled to an end of a resistor 1001, and another end of resistor 1001 is coupled to node 1002. Two resistors in series 1003 are coupled between node 1002 and node 1031. Another two resistors in series 1004 are likewise coupled to node 1002 with another end of series 1004 coupled to a source node of a p-type transistor 1011. A drain node of p-type transistor 1011 is coupled to node 334.

Another leg of variable resistor 1000 includes three resistors in series 1005 coupled to node 1002 at one end and to a source node of a p-type transistor 1012 at another end. A drain node of p-type transistor 1012 is coupled to node 334.

A set of four resistors in series 1006 is coupled to node 1002 at one end and to a source node of p-type transistor 1013 at another end. A drain node of transistor 1013 is coupled to node 334.

Another set of four resistors in series 1007 is coupled to node 1002 at one end and to a source node of a p-type transistor 1014 at another end. P-type transistor 1014 has a drain node coupled to node 334.

Even though five legs, namely resistor series 1003 through 1007, are illustratively depicted for variable resistor 1000, it should be appreciated that more or less than the five legs may be used. Furthermore, even though different numbers of resistors in series are depicted, other numbers of resistors in series may be used.

It should be understood that all resistors illustratively depicted for variable resistor 1000 may have approximately the same resistance. Bit settings or programming bits 624-1 for resistor R3 are provided to nonvolatile memory and/or combinatorial logic 1010. In response to such programming, nonvolatile memory and/or combinatorial logic 1010 provides signals 1021 through 1024 respectively to gates of p-type transistors 1011 through 1014.

Even though p-type resistors are illustratively shown, it should be understood that n-type transistors may be used, or a combination of p-type and n-type transistors. Transistors 1011 through 1014 are in source-to-drain series with resistor series 1004 through 1007, respectively, selectively selecting one or more legs associated therewith to provide a programmable resistance of a variable resistor R3.

For maximum resistance, all of signals 1021 through 1024 would be logic high, meaning that all of transistors 1011 through 1014 would be in a substantially nonconductive state, namely OFF. It should be understood that the resistance of each of p-type transistors 1011 through 1014 may be negligible when compared with their associated resistor series 1004 through 1007.

Series 1003 may provide a baseline resistance for variable resistor 1000. To change such baseline resistance of resistor R3, one or more of transistors 1011 through 1014 may be put in an ON state responsive to one or more of corresponding gating signals 1021 through 1024.

Optionally, one end of series of resistors 1003 may be coupled to a node 1002 and another end may be coupled to a node 1031. Node 1031 may be coupled to a source node of a p-type transistor 1015 and a drain node of p-type transistor may be coupled to a node 1032. Coupled in series between nodes 1031 and 1032 may be resistor 1008. Node 1032 may further be coupled to a source node of p-type transistor 1016, and a drain node of p-type transistor 1016 may be coupled to node 334. In series between nodes 1032 and 334 may be coupled a resistor 1009.

Gating signals 1025 and 1026 from nonvolatile memory and/or combinatorial logic 1010 may be respectively provided to gates of transistors 1015 and 1016. Thus, optionally, a first or baseline leg of variable resistor 1000 may have a baseline resistance associated with series 1003, where both p-type transistors 1015 and 1016 are in an ON state responsive to signals 1025 and 1026, respectively. However, to increase resistance of such baseline resistance, either or both of p-type transistors 1015 and 1016 may be put in an OFF state.

Figure 11:
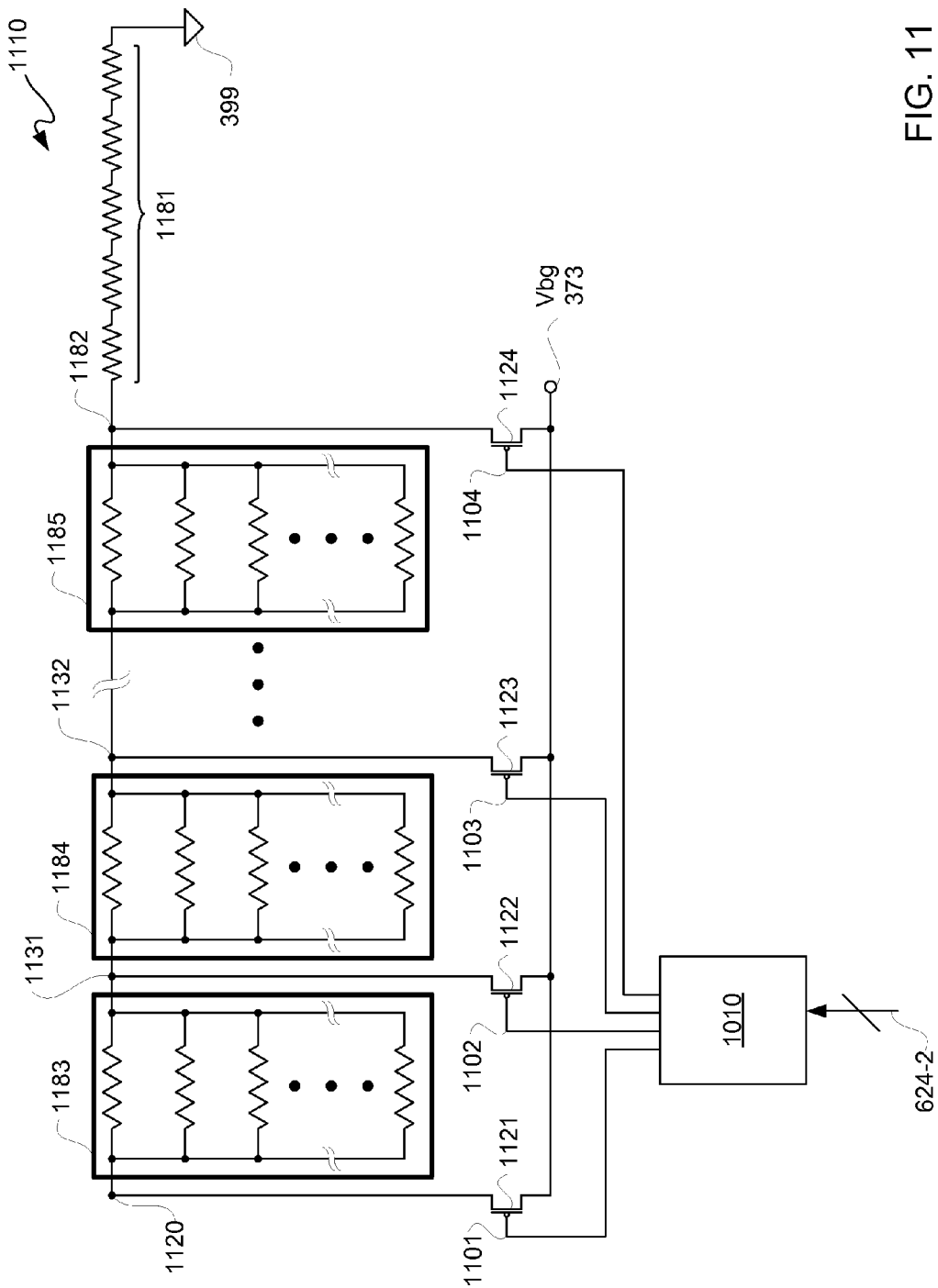
FIG. 11 is a circuit diagram depicting an exemplary embodiment of a variable resistor that may be used as another variable resistor of the bandgap reference circuit of FIGS. 2 and 3.

FIG. 11 is a circuit diagram depicting an exemplary embodiment of a variable resistor 1100. Variable resistor 1100 may be used as variable resistor R4 of bandgap reference circuit 200 of FIG. 3.

Variable resistor 1100 includes a series of resistors 1181 coupled at one end to ground 399 and at another end to a node 1182. Even though five resistors are illustratively depicted for the series of resistors 1181, it should be understood that fewer or more than five resistors may used. Variable resistor 1110 further includes sets of parallel resistors 1183, 1184, and 1185. Even though only three sets of parallel resistors are illustratively depicted, it should be appreciated that fewer or more than three sets of parallel resistors may be implemented. Sets of parallel resistors 1183, 1184, and 1185 are coupled in series between nodes 1182 and 1120. Bandgap output voltage node 373, which is a node from which bandgap voltage 202 may be sourced, is coupled to source nodes of p-type transistors 1121 through 1124. Even though p-type transistors are illustratively depicted, it should be understood that n-type or a combination of n- and p-type transistors may be used.

An intermediate node or tap is coupled between sets of parallel resistors. Parallel resistors 1185 are in series between nodes 1182 and 1132. Parallel resistors 1184 are in series between nodes 1132 and 1131. Parallel resistors 1183 are in series between nodes 1131 and 1120.

Nodes 1120, 1131, 1132, and 1182 are respectively coupled to drain nodes of p-type transistors 1121, 1122, 1123, and 1124. Again, source nodes of p-type transistors 1121, 1122, 1123, and 1124 are all coupled to output voltage node 373 for receiving bandgap voltage 202.

Gates of p-type transistors 1121 through 1124 are respectively coupled to receive select signals 1101 through 1104 from nonvolatile memory and/or combinatorial logic 1010. Nonvolatile memory and/or combinatorial logic 1010 is coupled to receive bit setting or programming bits 624-2. It should be understood that a bit setting may be formed of bit settings 624-1 and 624-2.

In response to bit setting 624-2, one of select signals 1101 through 1104 is asserted (i.e., logic low for this embodiment), and the remainder of select signals 1101 through 1104 are not asserted (i.e., logic high for this embodiment). In this exemplary embodiment, transistors 1121 through 1124 collectively provide a 4-to-1 multiplexer. Thus, for purposes of clarity by way of example and not limitation, if there are only three sets of parallel resistors, namely, sets of parallel resistors 1183, 1184, and 1185, and select signal 1102 is asserted, then the following happens. Transistors 1121, 1123, and 1124 are all in an OFF state responsive to non-assertion (i.e., logic high for this embodiment) of select signals 1101, 1103, and 1104. Transistor 1122 is in an ON state responsive to assertion of select signal 1102 (i.e., logic low for this embodiment), and thus bandgap voltage 202 at output voltage node 373 is coupled to node 1131. Accordingly, resistance of parallel set of resistors 1184, resistance of parallel set of resistors 1185, and resistance of series of resistors 1181 are effectively summed for providing any shift in output bandgap voltage 202. Of course, any one of select signals 1101 through 1104 may be asserted in this embodiment for providing a stepwise variable resistance R4 of FIG. 3.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for providing a bandgap voltage, comprising:
defining a current density range associated with a plurality of temperatures, wherein a scalability factor associated with the bandgap voltage is relatively constant within the current density range for each temperature of the plurality of temperatures;

shifting current density of a current in a bandgap circuit into the current density range having at least a substantially stable scaling factor to enhance temperature stability of the bandgap voltage; and moving the bandgap voltage output to a target voltage.

2. The method according to claim 1, further comprising:
adjusting a first resistive load of the bandgap circuit to provide the shifting; and
adjusting a second resistive load of the bandgap circuit to provide the moving.

3. The method according to claim 2, further comprising:
determining first information for the bandgap circuit at a first temperature;
determining second information of the bandgap circuit at a second temperature different from the first temperature; and
determining bit settings responsive to the first information and the second information for the adjusting of the first resistive load and the adjusting of the second resistive load.

4. The method according to claim 3, wherein the determining of the first information and the second information include:
supplying a reference voltage to a resistance ladder;
tapping nodes of the resistance ladder to obtain analog voltage levels therefrom; and
comparing the bandgap voltage to each of the analog voltage levels to provide digital outputs;
wherein first outputs of the digital outputs obtained at the first temperature is the first information; and
wherein second outputs of the digital outputs obtained at the second temperature is the second information.

5. The method according to claim 3, further comprising:
programming non-volatile memory elements with the bit settings for the adjusting of the first resistive load and the second resistive load.

6. The method according to claim 3, further comprising:
providing the bit settings to combinatorial logic for the adjusting of the first resistive load and the second resistive load.

7. The method according to claim 3, wherein;
the first information is obtained at a wafer level; and
the second information is obtained at a die level;
wherein the bandgap circuit is located on a die obtained from a wafer.

8. A method for manufacturing semiconductor dice, comprising:
wafer-level probing the dice to obtain first digital information associated with bandgap voltages output from bandgap circuits of the dice at a first temperature;
storing the first digital information in association with the dice;
after dicing, testing the dice at a second temperature, different from the first temperature, to obtain second digital information associated with the bandgap voltages output from the bandgap circuits;
retrieving the first digital information from storage;
obtaining code settings responsive to the first digital information and the second digital information for the bandgap circuits of the dice; and
adjusting at least one of a first resistive load and a second resistive load of a bandgap circuit of the bandgap circuits responsive to application of a code setting of the code settings to a die of the dice.

9. The method according to claim 8, wherein the adjusting of the first resistive load shifts current density of a current in the bandgap circuit into a current density range having at least a substantially stable scaling factor to enhance temperature stability of a bandgap voltage.

10. The method according to claim 8, wherein the adjusting of the second resistive load moves the bandgap voltage output to be centered to a target voltage range.

11. The method according to claim 8, wherein the storage is nonvolatile memory of each of the dice; and wherein the wafer-level probing includes:
supplying a first reference voltage to a resistance ladder of each of the dice;
tapping nodes of the resistance ladder of each of the dice to obtain first analog voltage levels therefrom; and
comparing the bandgap voltages of the dice to the first analog voltages to provide first digital outputs;
wherein the first digital outputs obtained at the first temperature is the first digital information.

12. The method according to claim 11, wherein the testing includes:
supplying a second reference voltage to the resistance ladder of each of the dice;
tapping nodes of the resistance ladder of each of the dice to obtain second analog voltage levels therefrom; and
comparing the bandgap voltages of the dice to the second analog voltages to provide second digital outputs;
wherein the second digital outputs obtained at the second temperature is the second digital information.

13. The method according to claim 12, wherein:
the first reference voltage and the second reference voltage are separate external voltages; and
the resistance ladder of each of the dice is coupled to an analog-to-digital converter of each of the dice for the comparing to provide the first digital outputs and the comparing to provide the second digital outputs.

14. The method according to claim 8, wherein the adjusting the at least one of the first resistive load and the second resistive load of the die includes programming non-volatile memory elements of the die with the code setting for the adjusting of the at least one of the first resistive load and the second resistive load.

15. The method according to claim 8, wherein the adjusting the at least one of the first resistive load and the second resistive load of the die includes applying the code setting to combinatorial logic of the die for the adjusting of the at least one of the first resistive load and the second resistive load.

16. The method according to claim 8, further comprising:
a data structure for storing first binary strings associated with combinations of the first digital information and second binary strings associated with combinations of the second digital information in pairs thereof for the obtaining of the code settings responsive to the first digital information and the second digital information for the bandgap circuits of the dice;
wherein the data structure is stored in the storage; and
wherein the storage is external memory with respect to the dice.

17. An integrated circuit, comprising:
a bandgap circuit having a first adjustable resistive load and a second adjustable resistive load;
wherein the first adjustable resistive load is for shifting current density of a diode input current in the bandgap circuit into a current density range having at least a substantially stable scaling factor for each temperature of a plurality of temperatures to enhance temperature stability of a bandgap voltage output from the bandgap circuit, wherein the current density range is associated with the plurality of temperatures;

wherein the second adjustable resistive load is for moving the bandgap voltage output from the bandgap circuit to a target voltage; and a voltage-to-current converter coupled to receive the bandgap voltage from the bandgap circuit and configured to convert the bandgap voltage into a tracked current.

18. The integrated circuit according to claim 17, wherein the tracked current is a process-voltage-temperature-tracked current ("PVT-tracked current").

19. The integrated circuit according to claim 17, wherein the bandgap circuit is a sub-one volt bandgap circuit.

20. The integrated circuit according to claim 17, wherein the bandgap circuit includes:

a first diode coupled in parallel with a first resistor;

the first diode coupled between a first feedback voltage node and ground in a forward biased direction;

the first adjustable resistive load coupled in series with a second diode;

wherein the second diode is formed of a plurality of diodes coupled in parallel;

the second diode coupled between the first adjustable resistive load and the ground in the forward biased direction;

the first adjustable resistive load and the second diode series coupled in parallel with a second resistor;

the first adjustable resistive load and the second resistor coupled at a second feedback voltage node;

a source/drain node of a first transistor coupled to the first feedback voltage node;

a source/drain node of a second transistor coupled to the second feedback voltage node;

a source/drain node of a third transistor coupled to an output node from which the bandgap voltage is output;

the second adjustable resistive load coupled between the output node and the ground;

a source/drain node of each of the first transistor, the second transistor, and the third transistor coupled to a supply voltage bus;

a gate of each of the first transistor, the second transistor, and the third transistor coupled to receive an analog output of an op-amp; and a first input and a second input of the op-amp respectively coupled to the first feedback voltage node and the second feedback voltage node.

\* \* \* \* \*